United States Patent [19]

Compton et al.

[11] 4,272,775

[45] Jun. 9, 1981

[54] LASER TRIM PROTECTION PROCESS AND STRUCTURE

[75] Inventors: James B. Compton, Los Gatos; Robert A. Cometta, San Jose; Daniel D. Culmer, Sunnyvale, all of Calif.

[73] Assignee: National Semiconductor Corporation, Santa Clara, Calif.

[21] Appl. No.: 45,323

[22] Filed: Jun. 4, 1979

Related U.S. Application Data

[62] Division of Ser. No. 921,743, Jul. 3, 1978, Pat. No. 4,179,310.

[51] Int. Cl.³ .......................................... H01L 27/14
[52] U.S. Cl. .................................... 357/29; 357/4; 357/51; 357/22; 219/121 L; 219/121 LH
[58] Field of Search ................. 357/29, 4, 18, 51, 22; 219/121 L, 121 LH

[56] References Cited

U.S. PATENT DOCUMENTS

| | | | |
|---|---|---|---|
| 4,172,741 | 10/1979 | Johnson | 148/1.5 |
| 4,190,854 | 2/1980 | Redfern | 357/51 |

*Primary Examiner*—Martin H. Edlow
*Attorney, Agent, or Firm*—Willis E. Higgins

[57] ABSTRACT

An element of an integrated circuit, such as an ion implanted region or a metal layer, may be laser trimmed without exposing P-N junctions or other circuit elements not to be trimmed to damage by the laser through use of the present protection process and structure. In the process, an oxide through which the laser trimming is carried out is formed over a selected portion of the circuit to be trimmed by the laser. A bare layer of a metal reflective to the laser radiant energy beam, such as aluminum, gold or silver, is formed surrounding the selected portion of the circuit. The selected portion of the integrated circuit is then trimmed with the laser. The oxide promotes trimming in the selected area by absorbing the laser radiant energy beam. The bare metal layer protects the portion of the integrated circuit underlying it by reflecting most of its energy.

9 Claims, 3 Drawing Figures

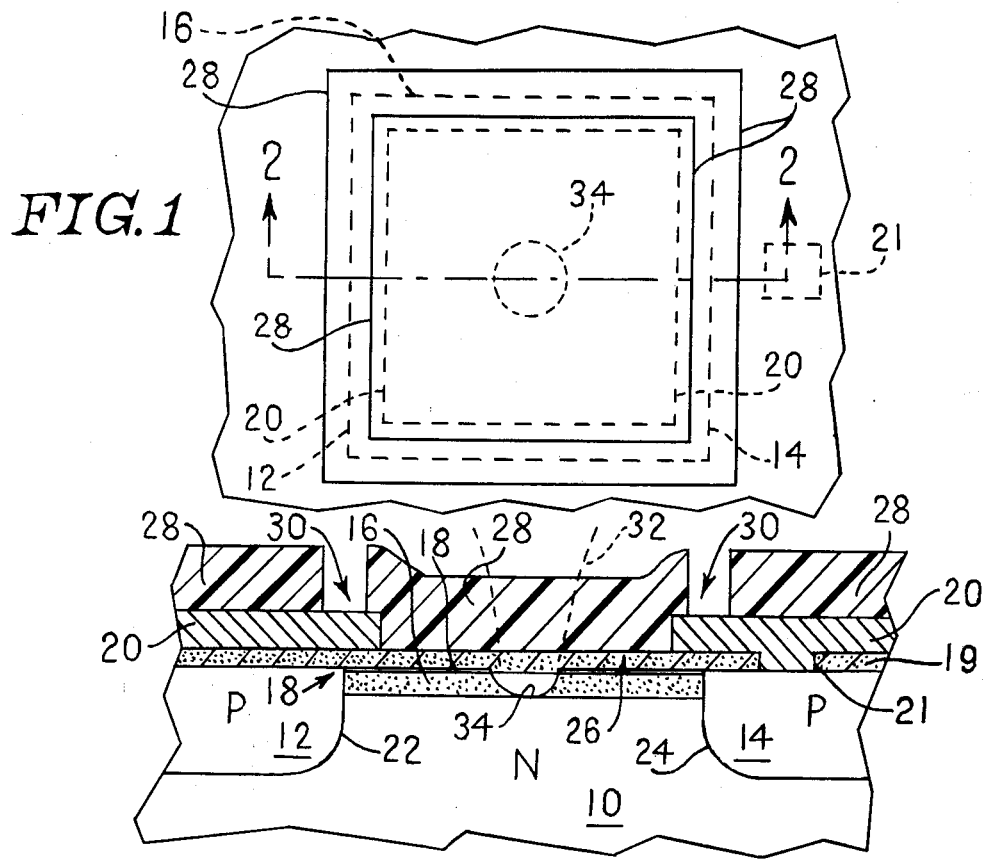
FIG.1
FIG.2
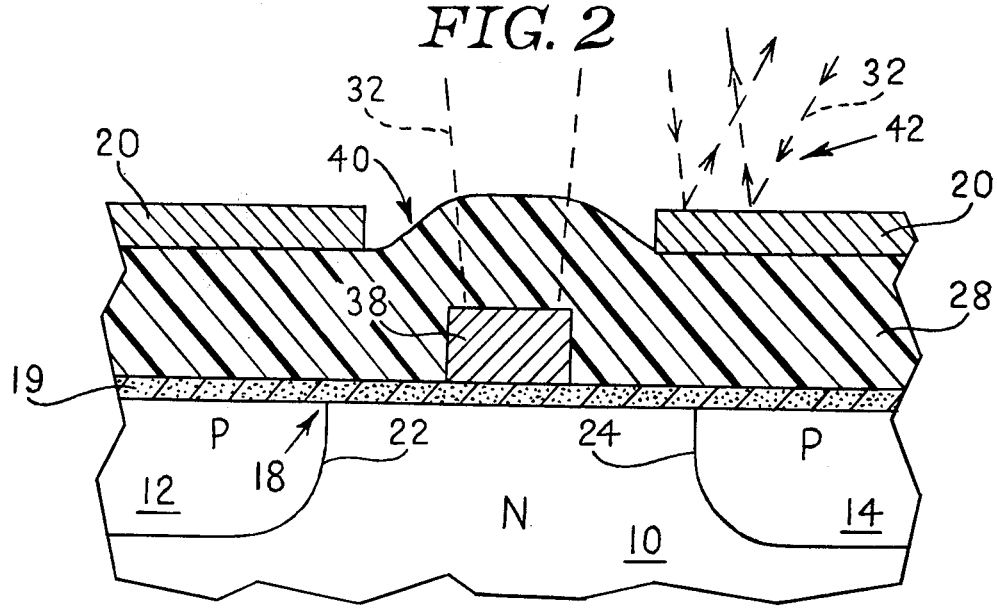
FIG.3

LASER TRIM PROTECTION PROCESS AND STRUCTURE

This is a division of Application Ser. No. 921,743, filed July 3, 1978, now U.S. Pat. No. 4,179,310.

BACKGROUND OF THE INVENTION

1. Field of the Invention

This invention relates to an integrated circuit fabrication process in which a laser radiant energy beam is employed for the purpose of trimming one or more elements of the circuit. More particularly, it relates to such a process in which special steps are taken to protect circuit elements not to be trimmed from damage by a laser radiant energy beam used to trim other elements of the circuit, and to the protection structure so produced.

2. Description of the Prior Art

The use of a laser for trimming both active and passive devices in an integrated circuit is known in the art. For example, Johnson, commonly assigned application Ser. No. 830,979, filed Sept. 6, 1977, discloses the use of a laser for trimming a region in a semiconductor substrate forming a part of a transistor. That application also points out that it is known to use a laser for trimming thick and thin film resistors, as well as for severing shorting links.

While such uses of laser radiant energy beams have proved to be successful for accomplishing their intended purpose, care must be taken to avoid having the laser beam contact other portions of the integrated circuit not to be trimmed. Inability to maintain close enough control over the laser beam to avoid contacting circuit elements not to be trimmed has proved to be a significant yield detractor in the fabrication of laser trimmed circuits, particularly under high volume automated process conditions. A need therefore remains for improvement of processes for laser trimming of integrated circuits.

SUMMARY OF THE INVENTION

Accordingly, it is an object of this invention to provide a method for laser trimming of an integrated circuit element in which damage to adjacent semiconductor structure through inadvertent contact by the laser is prevented.

It is another object of the invention to provide a novel method and structure for protecting adjacent portions of an integrated circuit structure against damage during laser trimming of a selected portion of the integrated circuit.

It is another object of this invention to increase the power differential in laser trimming between that necessary to carry out the desired trimming and that which will damage surrounding structure.

It is a still further object of the invention to provide a method and structure which will produce rapid laser trimming of a portion of an integrated circuit while preventing damage to adjacent portions of the circuit should they incidentally be contacted by the laser beam.

These and related objects may be achieved through use of the novel protection process and structure herein disclosed. In accordance with the invention, an oxide is formed over a selected portion of an integrated circuit to be trimmed through use of a laser radiant beam. A bare layer of a metal reflective to the laser radiant energy beam, such as aluminum, gold or silver, alloys of these metals, and the like, is formed surrounding the selected portion of the circuit. The selected portion of the integrated circuit is then trimmed with a laser. It has been found that the oxide over the selected portion of the integrated circuit actually promotes the trimming operation by absorbing the laser beam. The reflective metal layer, on the other hand, reflects the laser beam and prevents it from damaging portions of the integrated circuit not to be trimmed, which underlie the reflective metal layer. This protection process and structure may be used either where a region in a silicon or other semiconductor substrate forming part of a transistor is trimmed or where another metal or similar layer is employed to form a resistive element or a shorting link in the integrated circuit. The bare metal layer may be deposited after formation of the oxide over the portion of the circuit to be trimmed, or the metal layer may be deposited before formation of the oxide, and the oxide removed to expose bare metal where the metal layer is to protect the circuit. Where the oxide overlies the reflective metal, the degree of protection obtained from the reflective metal is far less than with bare metal, due to absorption of some of the laser energy by the oxide.

The attainment of the foregoing and related objects, advantages and features of the invention should be more readily apparent after review of the following more detailed description of the invention, taken in conjunction with the drawings, in which:

DESCRIPTION OF THE DRAWINGS

FIG. 1 is a plan of a portion of an integrated circuit including a structure in accordance with the invention;

FIG. 2 is a cross-section, taken along the line 2—2' in FIG. 1; and

FIG. 3 is a similar cross-section view of another embodiment of a structure in accordance with the invention.

DETAILED DESCRIPTION OF THE INVENTION

Turning now to the drawings, more particularly to FIGS. 1 and 2, a protection structure in accordance with the invention is shown. A silicon substrate 10, shown as N-type conductivity, has two P-type regions 12 and 14 extending from its upper surface. These regions are formed by a conventional diffusion step and constitute the current flow electrodes of a junction field effect transistor (JFET). Regions 12 and 14 are connected by P-type region 16, which constitutes the channel of the JFET. N-type region 18 on top of channel 16 serves as the top gate of the JFET. Substrate 10, which may either be bulk silicon or an N-type epitaxial layer grown on top of an underlying P-type semiconductor substrate, forms the bottom gate of the JFET. An insulating layer 19 of silicon oxide is vapor deposited over the substrate to a thickness of between about 3,000 and 7,000 Angstroms, with a 4,000 Angstrom thickness especially preferred. A vacuum evaporated aluminum layer 20 having a thickness between about 7,000 and 13,000 Angstroms, with an especially preferred thickness of about 10,000 Angstroms is provided in contact with insulating layer 19. Since aluminum layer 20 is employed as an interconnection metallurgy as well as a reflective metal layer in accordance with the invention, an opening 21 is provided to allow layer 20 to contact region 14. Similar openings are provided using conventional photoresist masking and etching steps wherever contact to the silicon substrate is desired. The aluminum layer 20 extends over P-N junctions 22 and 24, formed respectively between regions 12 and 14 and substrate 10. An opening 26 is provided in aluminum layer 20 in the region of channel 16. A vapor deposited silicon oxide layer 28, also of about 10,000 Angstroms thickness, is provided on top of aluminum layer 20 and in direct contact with the insulating layer 19 in the area of channel 16 to give a total preferred thickness in the channel area of about 15,000 Angstroms. Silicon oxide layer 28 is etched away at 30, where aluminum layer 20 overlies the P-N junctions 22 and 24. Aluminum layer 20 should be exposed at 30 in order to provide maximum protection of the P-N junctions 22 and 24 against laser beam 32, used to trim channel 16 at 34. This protection is necessary since the laser beam 32 may inadvertently impinge on the areas 30 during the positioning of substrate 10 with respect to laser beam 32.

FIG. 3 shows an alternative embodiment of a protection structure in accordance with the invention. As in FIGS. 1 and 2, an N-type substrate 10 has P-diffused regions 12 and 14 extending downward from its upper surface. P regions 12 and 14 are bounded by P-N junctions 22 and 24, respectively. Vapor deposited silicon oxide layer 19 having a thickness between about 3,000 and 7,000 Angstroms, with 4,000 Angstroms especially preferred, serves to insulate the upper surface of substrate 10, except where electrical contact is desired. In this portion of the integrated circuit, no such electrical contact is desired, so no opening corresponding to opening 21 in FIGS. 1 and 2 is shown.

In this embodiment, the portion of the integrated circuit to be trimmed by means of laser beam 32 is an aluminum shorting link 38, deposited by vacuum evaporation to a thickness of between about 7,000 and 13,000 Angstroms, with a thickness of about 10,000 Angstroms being especially preferred. Vapor deposited silicon oxide layer 28 is formed over aluminum link 38, also desirably to a thickness of between about 7,000 and 13,000 Angstroms, with a thickness of about 10,000 Angstroms being especially preferred. Aluminum protective layer 20 is then vacuum evaporated on top of silicon oxide layer 28, also to a thickness within these same ranges, with about 10,000 Angstroms again being especially preferred. Opening 40 is then formed in aluminum layer 20 through a conventional photoresist masking and etching sequence. It should be noted that aluminum protective layer 20 extends over P-N junctions 22 and 24 after aperture 40 has been formed, in order to protect these junctions against damage by incidental impact of laser beam 32. As in the case of FIGS. 1 and 2, the vapor deposited silicon oxide layer 28 absorbs radiant energy from the laser beam 32, thus facilitating the trimming of aluminum link 38. Aluminum link 38 may either be trimmed to reduce its cross sectional area and therefore increase its resistance, or severed completely, which is the more common practice. Aluminum protective layer 20, on the other hand, reflects the laser light 32 and is most effective in doing so if the layer 20 is left bare where protection of the underlying structure against damage by the laser beam 32 is desired. The manner in which aluminum layer 20 protects the P-N junctions 22 and 24 against damage by the laser beam 32 is indicated at 42 and shows laser beam 32 being reflected away from the remainder of the integrated circuit structure by aluminum protective layer 20.

The degree of protection afforded by aluminum layer 20 in both embodiments is quite substantial. Given a powerful enough laser beam, aluminum layer 20 will be removed. However, given a YAG laser focused to about one-half mil (thousandths of an inch) spot size, 80 to 100 milliwatts of power in laser beam 32 is required to cause removal of the bare metal layer 20 in either embodiment. In contrast, only about 35 milliwatts of power is required to trim aluminum link 38. Only about half as much power, or about 18 milliwatts, is required in order to trim P-type region 16 in FIGS. 1 and 2, which extends about one micron into the surface of silicon substrate 10. Although any laser with comparable output power is operable for use of the present invention, a Control Model 510 YAG laser, operated $TEM_{0,0}$ has been found to be especially suited for use with the invention.

The structures shown in FIGS. 1 to 3 may be fabricated using conventional integrated circuit process techniques well known in the art. Since the process of this invention does not require alteration of the techniques used in the semiconductor industry to form the individual regions and layers, those techniques will not be described in detail. N-type silicon substrate 10 shown is typically an epitaxial layer about 1 mil thick with a resistivity of about 5.0 ohm centimeters, grown on a P-type silicon wafer having a thickness between 6 and 8 mils and a resistivity of about 10 ohm centimeters. P-regions 12 and 14 are typically formed by conventional diffusion techniques, in which an acceptor impurity, such as boron, is diffused in a shallow predeposition through apertures in a silicon oxide mask, then heated to drive in the diffusion, giving a graded impurity distribution decreasing with distance from the upper surface of substrate 10, with a shape corresponding roughly to that shown. Channel 16 and top gate 18 shown in FIG. 2 are preferably formed by successive ion implantation of acceptor and donor impurities, with channel 16 extending into silicon body 10 about 1 micron. Aluminum link 38 is desirably formed by vacuum evaporation, followed by photoresist masking and etching to give the shape shown. In the embodiment of FIGS. 1 and 2, the aluminum protective layer 20 is then also formed by vacuum evaporation in accordance with conventional technique. In the embodiment of FIG. 3, the protective aluminum layer 20 is formed in the same manner, but after formation of the silicon oxide layer 28. Both aluminum layers may be substantially pure aluminum, or an alloy of aluminum, such as with about 3 to 5 weight percent copper, in accordance with known practice. The openings in the various layers may all be formed by photoresist masking and etching steps in accordance with known techniques.

It should be noted that variations of the embodiments shown may be provided. For example, the conductivity type of the substrate and regions 12 and 14 could be reversed. The approach shown in FIG. 3, in which the protective aluminum layer 20 is on top of vapor deposited oxide layer 28, could be employed where a region in the silicon substrate 10 is to be trimmed, such as in FIGS. 1 and 2. Also, the approach of FIG. 1, in which the aluminum protective layer 20 underlies the vapor deposited oxide except where protection against the laser beam is desired, could also be employed where a metal member, such as link 38, is to be trimmed, as in the embodiment of FIG. 3. While layer 38 has been described as an aluminum layer, it could also be a refractive metal exhibiting relatively high resistance, such as a silicon-chromium alloy, or the like. It is intended that such variations in form and detail be included within the spirit and scope of the claims defining the invention appended hereto.

It should now be apparent to those skilled in the art that a novel protection structure and process for protecting adjacent portions of an integrated circuit during laser trimming of a selected portion of the circuit has been provided. Provision of a bare metal layer reflective to the laser beam provides complete protection of adjacent diffusions against laser damage by incidental contact during trimming of a selected element. An unexpectedly high power level for the laser beam is required to remove the bare reflective metal layer in comparison to the power level required to accomplish the desired trimming. As a result, use of this invention produces a 400% yield improvement over that obtained with the same process conditions but without utilization of the invention, i.e., an increase in yield to about 25% from about 6-7%.

What is claimed is:

1. An integrated circuit structure, which comprises:
   (a) a semiconductor substrate of a first conductivity type,
   (b) a first region of second conductivity type in said semiconductor substrate and forming a P-N junction therewith,
   (c) a second region contiguous with said first region and including a circuit element to be trimmed by use of a radiant energy beam,
   (d) a first oxide on said semiconductor substrate overlying said second region including said circuit element,
   (e) a layer of a metal reflective to the radiant energy beam on said first oxide at least the P-N junction formed between said first region and said semiconductor substrate, and
   (f) a second oxide layer on said reflective metal layer, said second oxide layer having an opening which exposes said reflective metal layer over the P-N junction at the surface of said semiconductor substrate where said P-N junction is contiguous with said second region.

2. The integrated circuit structure of claim 1 in which the circuit element to be trimmed is a portion of the semiconductor body forming a P-N junction with its immediately contiguous semiconductor material.

3. The integrated circuit structure of claim 1 in which the semiconductor substrate is silicon, the oxide is silicon oxide, and the metal is aluminum, gold, silver, or an alloy thereof.

4. An integrated circuit structure, which comprises:
   (a) a semiconductor substrate of a first conduitivity type,
   (b) a first region of a second conductivity type in said semiconductor substrate and forming a P-N junction therewith,
   (c) a circuit element to be trimmed by use of a radiant energy beam and contiguous with said first region,
   (d) an oxide layer on said semiconductor substrate overlying said circuit element and said first region, and
   (e) a bare layer of a metal reflective to the radiant energy beam on said oxide layer, overlying at least the P-N junction, and being free of ohmic contact to said first region.

5. The integrated circuit structure of claim 4 in which the circuit element to be trimmed is a portion of the semiconductor body forming a P-N junction with its immediately contiguous semiconductor material.

6. The integrated circuit structure of claim 4 in which the circuit element to be trimmed comprises a second metal layer over a second oxide layer, which second oxide layer separates the second metal layer and semiconductor substrate.

7. The integrated circuit structure of claim 4 in which the reflective metal layer and the second metal layer are aluminum or an aluminum-copper alloy.

8. The integrated circuit structure of claim 4 in which the semiconductor substrate is silicon, the oxide is silicon oxide, and the metal is aluminum, gold, silver or an alloy thereof.

9. The integrated circuit structure of claim 6 in which said second metal layer is aluminum, an aluminum copper alloy, or an alloy of silicon and chromium.

* * * * *